(12) United States Patent
Djomehri et al.

(10) Patent No.: US 6,929,992 B1
(45) Date of Patent: Aug. 16, 2005

(54) STRAINED SILICON MOSFETS HAVING NMOS GATES WITH WORK FUNCTIONS FOR COMPENSATING NMOS THRESHOLD VOLTAGE SHIFT

(75) Inventors: Ihsan J. Djomehri, Mountain View, CA (US); Qi Xiang, San Jose, CA (US); Jung-Suk Goo, Stanford, CA (US); James N. Pan, Fishkill, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/738,496

(22) Filed: Dec. 17, 2003

(51) Int. Cl.[7] .......................................... H01L 21/8238
(52) U.S. Cl. ...................... 438/199; 438/223; 438/227
(58) Field of Search ................................. 438/199, 223, 438/224, 227, 228; 257/369, 371, 372, 373

(56) References Cited

U.S. PATENT DOCUMENTS

| | | | | |
|---|---|---|---|---|
| 5,920,774 A | * | 7/1999 | Wu | 438/224 |
| 6,130,123 A | * | 10/2000 | Liang et al. | 438/217 |
| 6,204,103 B1 | * | 3/2001 | Bai et al. | 438/224 |
| 6,750,519 B2 | * | 6/2004 | Lin et al. | 257/407 |

* cited by examiner

*Primary Examiner*—Hung Vu
(74) *Attorney, Agent, or Firm*—Foley & Lardner LLP

(57) ABSTRACT

The threshold voltage shift exhibited by strained silicon NMOS devices is compensated with respect to the threshold voltages of PMOS devices formed on the same substrate by increasing the work function of the NMOS gates. The NMOS gate work function exceeds the PMOS gate work function so as to compensate for a difference in the respective NMOS and PMOS threshold voltages. The NMOS gates are preferably fully silicided while the PMOS gates are partially silicided.

4 Claims, 13 Drawing Sheets

STRAINED SILICON MOSFETS HAVING NMOS GATES WITH WORK FUNCTIONS FOR COMPENSATING NMOS THRESHOLD VOLTAGE SHIFT

BACKGROUND OF THE INVENTION

1. Field of the Invention

The present invention relates generally to fabrication of metal oxide semiconductor field effect transistors (MOSFETs), and, more particularly, to MOSFETs that achieve improved carrier mobility through the incorporation of strained silicon.

2. Related Technology

Figure 1:
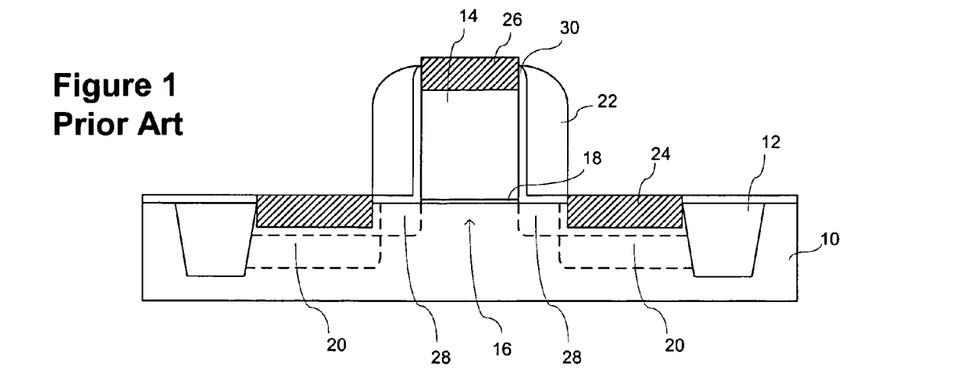
FIG. 1 shows a conventional MOSFET formed in accordance with conventional processing.

MOSFETs are a common component of integrated circuits (ICs). FIG. 1 shows a cross sectional view of a conventional MOSFET device. The MOSFET is fabricated on a silicon substrate 10 within an active region bounded by shallow trench isolations 12 that electrically isolate the active region of the MOSFET from other IC components fabricated on the substrate 10.

The MOSFET is comprised of a gate 14 that is separated from a channel region 16 in the substrate 10 by a thin gate insulator 18 such as silicon oxide or silicon oxynitride. A voltage applied to the gate 14 controls the availability of carriers in the channel region 16 through formation of an inversion layer in the channel. To minimize the resistance of the gate 14, the gate 14 is typically formed of a doped semiconductor material such as polysilicon.

The source and drain of the MOSFET comprise deep source and drain regions 20 formed on opposing sides of the channel region 16. The deep source and drain regions 20 are implanted by ion implantation subsequent to the formation of a spacer 22 around the gate 14, which serves as a mask during implantation to define the lateral positions of the deep source and drain regions 20 relative to the channel region 16.

Source and drain silicides 24 are formed on the deep source and drain regions 20 and are comprised of a compound comprising the substrate semiconductor material and a metal such as cobalt (Co) or nickel (Ni) to reduce contact resistance to the deep source and drain regions 20. The deep source and drain regions 20 are formed deeply enough to extend beyond the depth to which the source and drain silicides 24 are formed. The gate 14 likewise has a silicide 26 formed on its upper surface. A gate structure comprising a polysilicon material and an overlying silicide is sometimes referred to as a polycide gate.

The source and drain of the MOSFET further comprise shallow source and drain extensions 28. As dimensions of the MOSFET are reduced, short channel effects resulting from the small distance between the source and drain cause degradation of MOSFET performance. The use of shallow source and drain extensions 28 rather than deep source and drain regions near the ends of the channel 16 helps to reduce short channel effects. The shallow source and drain extensions 28 are implanted after the formation of a protective layer 30 around the gate 14 and over the substrate, and prior to the formation of the spacer 22. The gate 14 and the protective layer 30 act as an implantation mask to define the lateral position of the shallow source and drain extensions 28 relative to the channel region 16. Diffusion during subsequent annealing causes the shallow source and drain extensions 28 to extend slightly beneath the gate 14.

One option for increasing the performance of MOSFETs is to enhance the carrier mobility of the MOSFET semiconductor material so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is more widely spaced on average than a pure silicon lattice because of the presence of the larger germanium atoms in the lattice. Since the atoms of the silicon lattice align with the more widely spaced silicon germanium lattice, a tensile strain is created in the silicon layer. The silicon atoms are essentially pulled apart from one another. The amount of tensile strain applied to the silicon lattice increases with the proportion of germanium in the silicon germanium lattice.

Figure 2:
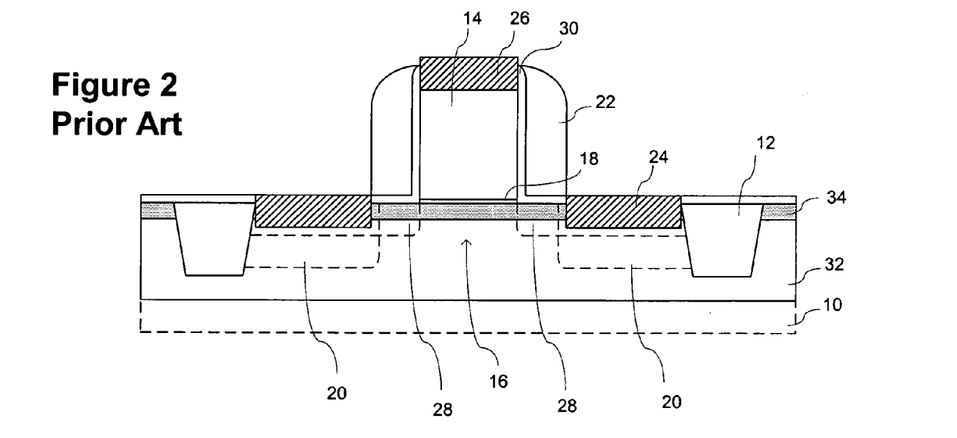
FIG. 2 shows a strained silicon MOSFET device.

The tensile strain applied to the silicon lattice increases carrier mobility. Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance. An example of a MOSFET incorporating a strained silicon layer is shown in FIG. 2. The MOSFET is fabricated on a substrate comprising a silicon germanium layer 32 grown on a silicon layer 10. An epitaxial layer of strained silicon 34 is grown on the silicon germanium layer 32. The MOSFET uses conventional MOSFET structures including deep source and drain regions 20, shallow source and drain extensions 28, a gate oxide layer 18, a gate 14 surrounded by spacers 30, 22, source and drain silicides 24, a gate silicide 26, and shallow trench isolations 12. The channel region of the MOSFET includes the strained silicon material, which provides enhanced carrier mobility between the source and drain.

Figure 3:
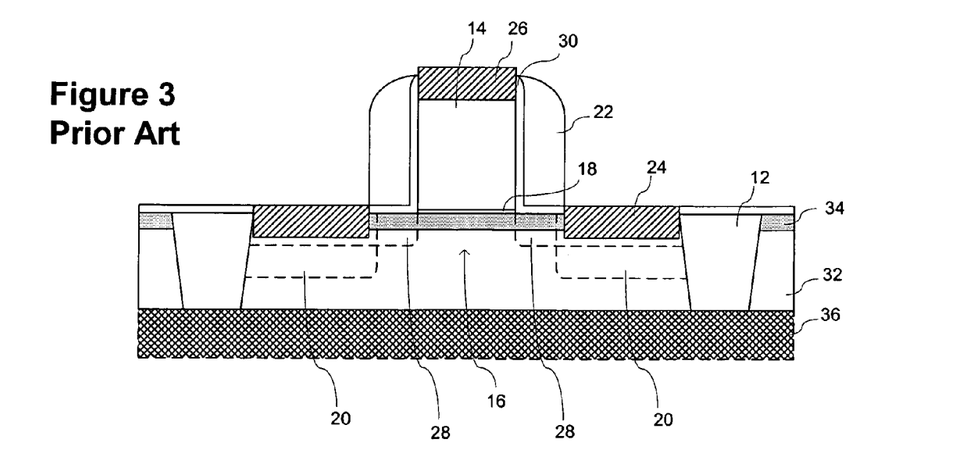
FIG. 3 shows a strained silicon MOSFET device formed on an SOI substrate.

FIG. 3 shows an example of a strained silicon MOSFET formed on a silicon-on-insulator (SOI) substrate. In this example, the MOSFET is formed on an SOI substrate that comprises a silicon germanium layer 32 provided on a dielectric substrate 36. The SOI substrate may be formed by a buried oxide (BOX) method or by bonding the oxidized surface of a silicon wafer to a silicon germanium layer formed on a second silicon wafer, and removing the silicon portion of the second wafer by fracturing after hydrogen implantation. In one alternative to the SOI structure of FIG. 3, strained silicon FinFETs comprised of monolithic silicon germanium FinFET bodies having strained silicon grown thereon may be formed from the silicon germanium SOI substrate.

One detrimental consequence of the use of strained silicon in MOSFETs is that the threshold voltage Vt that is required to create an inversion layer in the MOSFET channel is reduced by approximately 200 mV. The threshold voltage shift is the result of changes in the conduction bands of strained silicon compared to relaxed silicon, and the effects are therefore manifested primarily in NMOS devices. While a reduced threshold voltage is desirable in general because it reduces power consumption, the asymmetric reduction of NMOS threshold voltage relative to PMOS threshold voltage presents control issues in circuits such as CMOS circuits that employ both NMOS and PMOS devices. Also, a reduction in threshold voltage can produce an exponential increase in the leakage current that flows through the device in the off state, and hence the power consumption is detrimentally raised.

It is therefore desirable to compensate for the NMOS threshold voltage shift. The conventional approach to providing threshold voltage compensation is to increase the doping in the channel region. However, increased channel region doping causes increased Coulomb scattering and degrades electron mobility, thus decreasing device performance and detracting from the advantages that the use of strained silicon is meant to provide.

Therefore the performance provided by conventional strained silicon MOSFET technology is constrained by conflicting requirements. While strained silicon provides significant carrier mobility enhancement, strained silicon also reduces the NMOS threshold voltage, and this latter effect has heretofore required compensation through techniques that degrade the carrier mobility that the strained silicon is meant to provide. Thus the advantages achieved by incorporating strained silicon into MOSFET designs are partly offset by the disadvantages resulting from the conventional techniques that must be employed to compensate for the threshold voltage shift.

SUMMARY OF THE INVENTION

Embodiments of the present invention pertain to strained silicon MOSFET devices that exploit the benefits of strained silicon while compensating for the NMOS strained silicon threshold voltage shift in a manner that produces less carrier mobility degradation than the conventional compensation methods. In accordance with embodiments of the invention, the work function of the gate of an NMOS device is increased to compensate for the strained silicon threshold voltage shift. The work function of a material is the energy that is required to move an electron at the Fermi energy away from an atom to infinity, and is measured in electron volts eV. For purposes of this disclosure, the work function of an NMOS gate is discussed with reference to the work function of a PMOS gate formed in the same substrate, and the difference between the work function of the NMOS gate and the PMOS gate is represented by a voltage. By increasing the work function of an NMOS gate by approximately the amount of the NMOS threshold voltage shift, an additional voltage is required to create an inversion layer in the NMOS channel. The sum of the NMOS threshold voltage and the difference between the NMOS gate work function and the PMOS gate work function is referred to herein as the "effective threshold voltage" of the NMOS device. The NMOS gate work function is preferably increased by an amount that is approximately equal to the band gap of strained silicon as compared to relaxed silicon, thus making the effective threshold voltage of the NMOS device approximately the same as the threshold voltage of PMOS devices formed in the same substrate.

Work function is a material-specific property and thus the work function of an NMOS gate can be changed by changing the material properties of the gate. In accordance with preferred embodiments, the work function of the NMOS gate is increased relative to the PMOS gate to compensate for the threshold voltage shift. The NMOS gate work function is preferably increased by using a fully silicided NMOS gate and a conventional partially silicided PMOS gate. Silicidation of the NMOS and PMOS gates may be performed concurrently or independently.

In accordance with one embodiment of the invention, an NMOS transistor and a PMOS transistor are formed on a substrate and have strained silicon channel regions. The gate of the NMOS transistor has a work function that exceeds the work function of the gate of the PMOS transistor so as to compensate for a difference in the respective threshold voltages of the NMOS transistor and the PMOS transistor that is caused by the strained silicon in the channel regions. The difference in the work functions of the NMOS and PMOS gates is preferably approximately the same as the difference in the threshold voltages of the NMOS and PMOS transistors. The PMOS gate is partially silicided, while the NMOS gate is fully silicided. The NMOS and PMOS devices may be formed on a semiconductor substrate or on an SOI substrate, and may be FinFETs. The NMOS and PMOS devices may form a CMOS device or may be independent devices formed on the same substrate.

In accordance with another embodiment of the invention, an NMOS transistor and a PMOS transistor are formed on a substrate. The NMOS and PMOS transistors have polysilicon gates and strained silicon channels. Silicide portions of the respective NMOS and PMOS gates are then formed. After formation of the silicide portions, the gate of the NMOS transistor has a work function that exceeds a work function of the gate of the PMOS transistor so as to compensate for a difference in respective threshold voltages of the NMOS transistor and the PMOS transistor caused by the layer of strained silicon. The difference in the work functions of the NMOS and PMOS gates is preferably approximately the same as the difference in the threshold voltages of the NMOS and PMOS transistors.

In accordance with a further embodiment of the invention, there are formed an NMOS transistor and a PMOS transistor having strained silicon channel regions and gates comprising a polysilicon portion and a silicide portion. A metal layer is then formed in contact with the silicide portion of the NMOS gate while the PMOS gate is protected, and annealing is performed to fully silicide the NMOS gate, thus increasing the work function of the NMOS gate.

In accordance with another embodiment of the invention, an NMOS transistor and a PMOS transistor having strained silicon channels and polysilicon gates are formed. A portion of the NMOS polysilicon gate is removed. A metal layer is formed in contact with the NMOS gate and the PMOS gate, and then annealing is performed to form silicide portions of the NMOS gate and the PMOS gate. A fully silicided NMOS gate and a partially silicided PMOS gate are produced.

In accordance with a further embodiment of the invention, NMOS and PMOS transistors having strained silicon channels and polysilicon gates are formed. A portion of the PMOS gate is silicided while protecting the NMOS gate, and then the NMOS gate is fully silicided while protecting the PMOS gate.

DESCRIPTION OF THE DRAWINGS

Embodiments of the invention are described in conjunction with the following drawings, in which.

DETAILED DESCRIPTION OF PREFERRED EMBODIMENTS

Figure 4A:
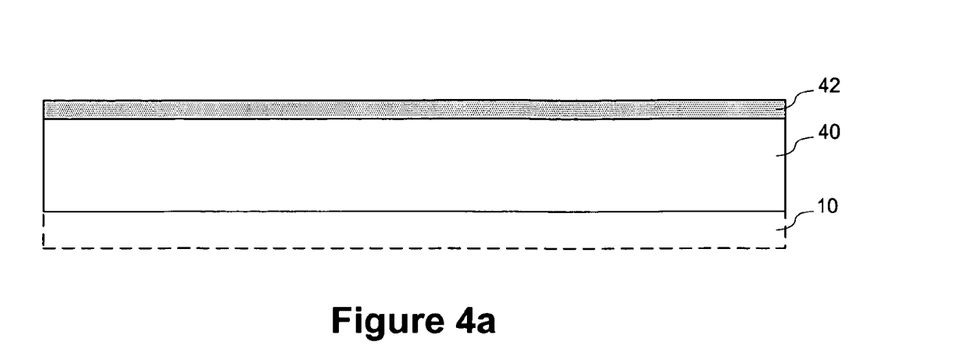
FIGS. 4a, 4b, 4c, 4d, 4e, 4f, 4g, 4h and 4i show structures formed during production of a MOSFET device in accordance with preferred embodiments of the invention.

FIGS. 4a–4i show structures formed during fabrication of a strained silicon MOSFET in accordance with preferred embodiments of the invention. FIG. 4a shows a structure comprising a layer of silicon germanium 40 grown on a silicon substrate 10. The layer of silicon germanium 40 has an epitaxial layer of strained silicon 42 grown on its surface. The silicon germanium layer 40 preferably has a composition $Si_{1-x}Ge_x$, where x is approximately 0.2, and is more generally in the range of 0.1 to 0.3. Silicon germanium may be grown, for example, by chemical vapor deposition using $Si_2H_6$ (disilane) and $GeH_4$ (germane) as source gases, with a substrate temperature of 600 to 900 degrees C., a $Si_2H_6$ partial pressure of 30 mPa, and a GeH4 partial pressure of 60 mPa. $SiH_4$ (silane) may be used as a source of silicon in alternative processes. Growth of the silicon germanium material may be initiated using these ratios, or alternatively the partial pressure of $GeH_4$ may be gradually increased beginning from a lower pressure or zero pressure to form a gradient composition. The thickness of the silicon germanium layer may be determined in accordance with the particular application. The upper portion of the silicon germanium substrate 40 on which the strained silicon layer 42 is grown should have a uniform composition.

The strained silicon layer 42 is preferably grown by chemical vapor deposition (CVD) using $Si_2H_6$ as a source gas with a partial pressure of 30 mPa and a substrate temperature of approximately 600 to 900 degrees C. The strained silicon layer is preferably grown to a thickness of 200 Angstroms. The maximum thickness of strained silicon that can be grown without misfit dislocations will depend on the percentage of germanium in the silicon germanium layer 40.

Figure 4B:
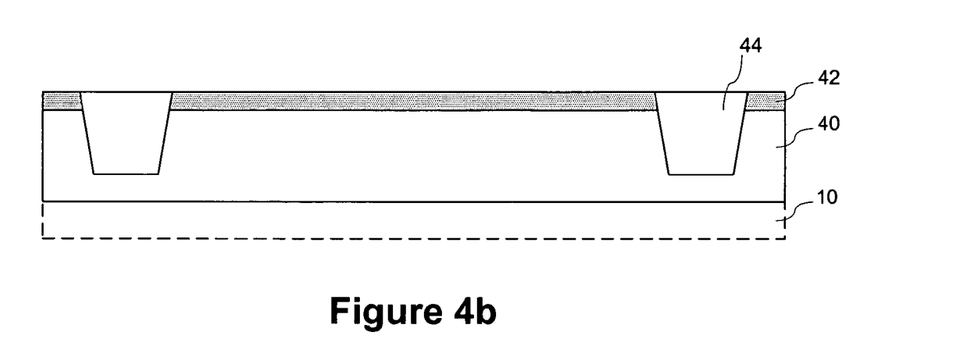

FIG. 4b shows the structure of FIG. 4a after formation of shallow trench isolations 44 having tapered sidewalls in the strained silicon layer 42 and the silicon germanium layer 40. The shallow trench isolations 44 define an active region of the substrate in which a MOSFET will be formed. The shallow trench isolations 44 may be formed by forming trenches in the strained silicon and silicon germanium, performing a brief thermal oxidation of the silicon germanium and strained silicon, and then depositing a layer of silicon oxide to a thickness that is sufficient to fill the trenches, such as by low pressure CVD (LPCVD) TEOS or atmospheric pressure ozone TEOS. The silicon oxide layer is then densified and planarized such as by chemical mechanical polishing or an etch back process, leaving shallow trench isolations 44 that are approximately level with the surface of the silicon germanium layer 42. In accordance with one preferred alternative, the shallow trench isolations 44 may be formed prior to growth of the strained silicon layer 42 on the silicon germanium layer 40 to avoid creation of misfit dislocations in the strained silicon 42 as a result of the high temperatures used during formation of the shallow trench isolations.

Figure 4C:
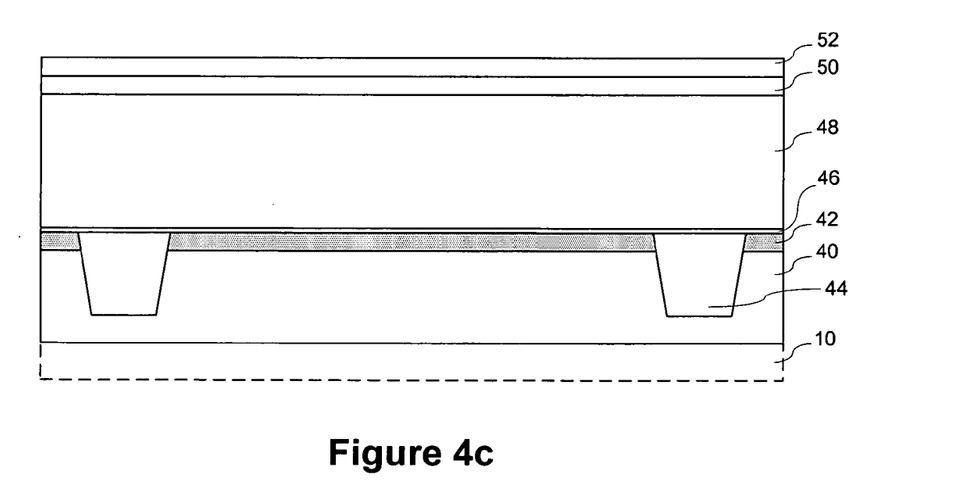

FIG. 4c shows the structure of FIG. 4b after formation of multiple layers of material over the strained silicon layer 42 and the shallow trench isolations 44. A thin gate insulating layer 46 is formed on the strained silicon layer 42. The gate insulating layer 46 is typically silicon oxide but may be another material such as silicon oxynitride. Silicon oxide may be grown by thermal oxidation of the strained silicon layer 42 or may be deposited by chemical vapor deposition. Formed over the gate insulating layer 46 is a gate conductive layer 48. The gate conductive layer 48 typically comprises polysilicon that is heavily doped with an n-type dopant such as arsenic or boron. In some instances the polysilicon may also be implanted with germanium to create strain for enhancing carrier mobility. Overlying the gate conductive layer 48 is a bi-layer hardmask structure comprising a lower hardmask layer 50, also referred to as a bottom antireflective coating (BARC), and an upper hardmask layer 52. In accordance with preferred embodiments, the lower hardmask layer 50 is silicon oxynitride, and the upper hardmask layer 52 is typically silicon nitride (e.g. $Si_3N_4$). The thicknesses of the layers are chosen to provide the desired antireflective properties.

Figure 4D:
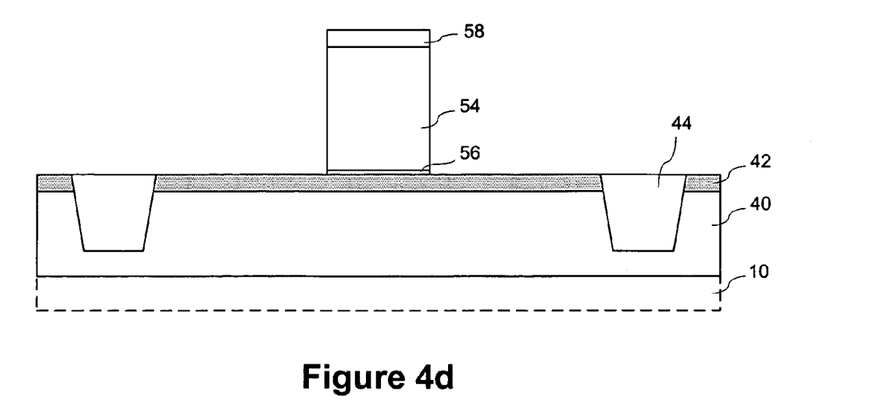

FIG. 4d shows the structure of FIG. 4c after patterning of the gate conductive layer to form a gate 54. Patterning of the gate conductive layer typically removes at least a portion of any unprotected gate insulator layer material, leaving a gate insulator 56 beneath the gate 54. Patterning is performed using a series of anisotropic etches that patterns the upper hardmask layer using a photoresist mask as an etch mask, then patterns the lower hardmask layer using the patterned upper hardmask layer as an etch mask, and then patterns the polysilicon using the patterned lower hardmask layer as an etch mask. In accordance with a first preferred embodiment, a protective cap 58 formed from the silicon oxynitride BARC layer is left on the gate 54.

Figure 4E:
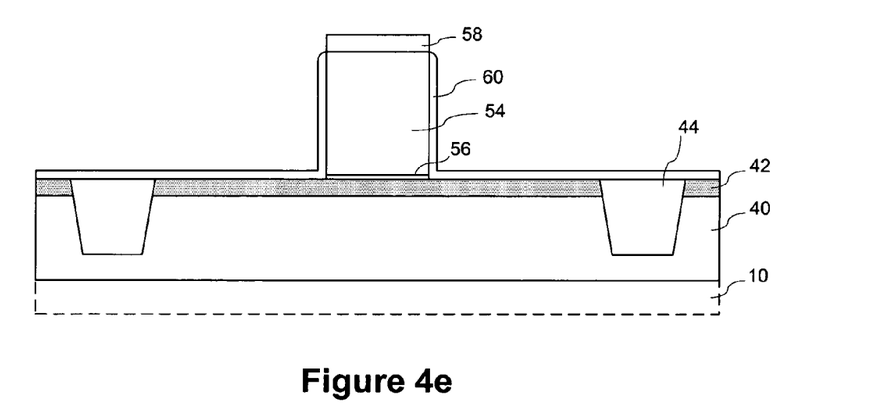

FIG. 4e shows the structure of FIG. 4d after formation of a protective silicon oxide layer 60 on the strained silicon layer 42 and the exposed sidewalls of the gate 54. The protective layer 60 may be formed by thermal oxidation of the gate 54 and strained silicon 42.

Figure 4F:
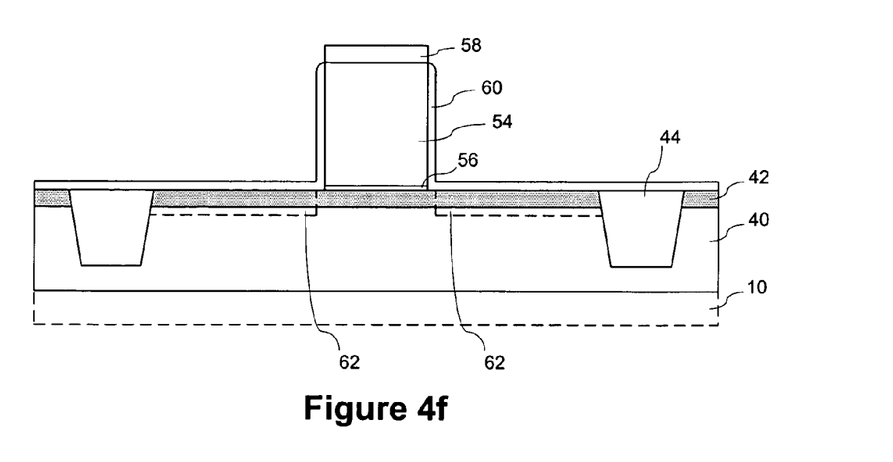

FIG. 4f shows the structure of FIG. 4e after implantation of dopant by ion implantation to form shallow source and drain extensions 62 in the strained silicon layer 42 and silicon germanium layer 40 at opposing sides of the gate 54. Halo regions (not shown) may be implanted prior to implantation of the shallow source and drain extensions 62. Halo regions are regions that are implanted with a dopant that has a conductivity type that is opposite to that of the source and drain region dopants. The dopant of the halo regions retards diffusion of the dopant of the source and drain extensions. Halo regions are preferably implanted using a low energy at an angle to the surface of the substrate so that the halo regions extend beneath the gate 60 to beyond the anticipated locations of the ends of the source and drain extensions 62 after annealing. In accordance with one alternative embodiment, a halo may be provided only for the shallow source extension. This may provide a number of benefits including better control of short channel effects and threshold voltage, better driving current, and reduced junction leakage and impact ionization compared to devices with dual halos.

Figure 4G:
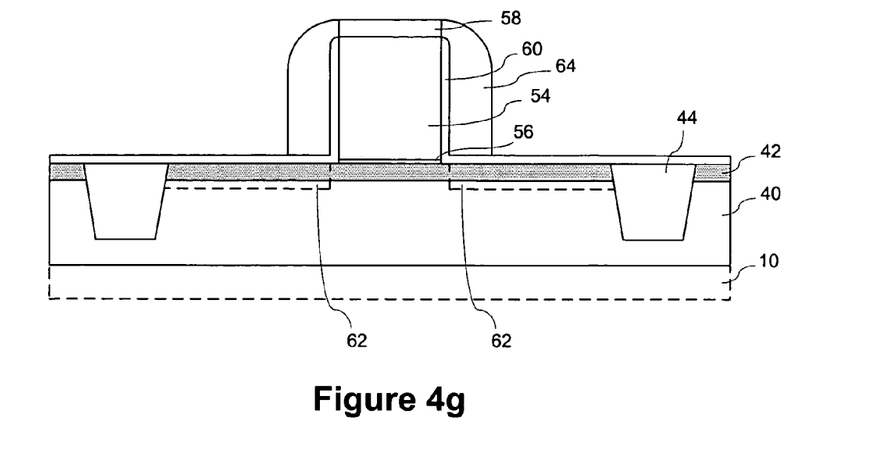

FIG. 4g shows the structure of FIG. 4f after formation of a spacer 64 around the gate 54. The spacer 64 is preferably formed of silicon oxide. The spacer 64 may be formed by depositing a conformal layer of silicon oxide, followed by an etch back process to remove the silicon oxide from the substrate, leaving silicon oxide on the sidewalls of the gate as spacers 64.

Figure 4H:
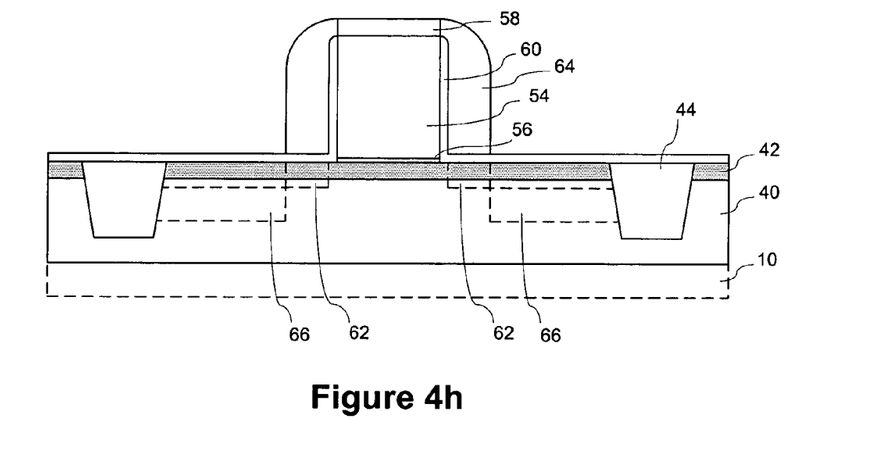

FIG. 4h shows the structure of FIG. 4g after formation of deep source and drain regions 66 in the strained silicon 42 and silicon germanium 40 layers at opposing sides of the gate 54 by implantation of dopant. The spacer 64 serves as a mask during implantation of the deep source and drain regions 66 to define the lateral positions of the source and drain regions 66 relative to the gate 54.

Figure 4I:
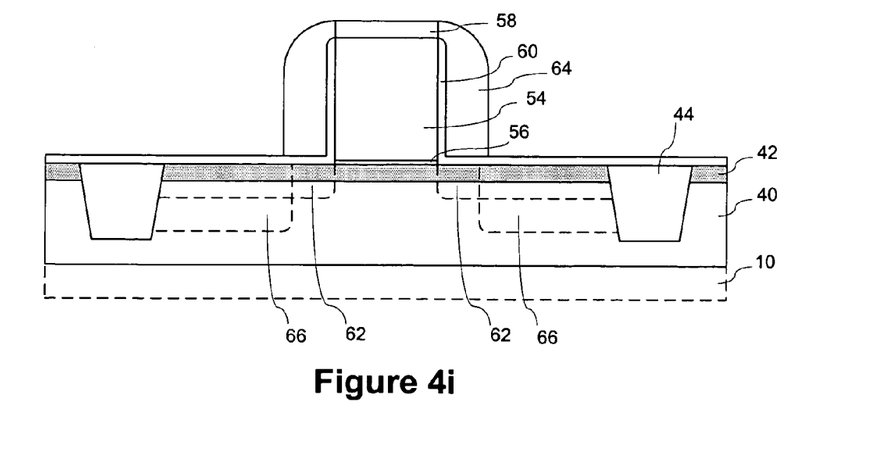

FIG. 4i shows the structure of FIG. 4h after performing rapid thermal annealing (RTA) to anneal the silicon germanium layer 40 and strained silicon layer 42 and to activate the dopants implanted in the shallow source and drain extensions 62 and the deep source and drain regions 66. During annealing the implanted dopant undergoes diffusion, causing a smoothing of the contours of the respective regions.

The processing of FIGS. 4a–4i may be employed to form both NMOS and PMOS devices by using appropriate doping for source and drain regions and for any necessary substrate wells. The processing of FIGS. 4a–4i may be used to form the initial structures employed in the preferred embodiments of FIGS. 5a–5f, 7a–7g, and 9, or alternative processing may be used.

FIGS. 5a–5f show structures formed during processing in accordance with a first preferred embodiment of the invention. In this embodiment, gate silicides are formed for both NMOS and PMOS devices, and then additional silicidation is selectively performed on the NMOS gate to fully silicide the NMOS gate in order to increase the NMOS gate work function relative to the PMOS gate work function.

Figure 5A:
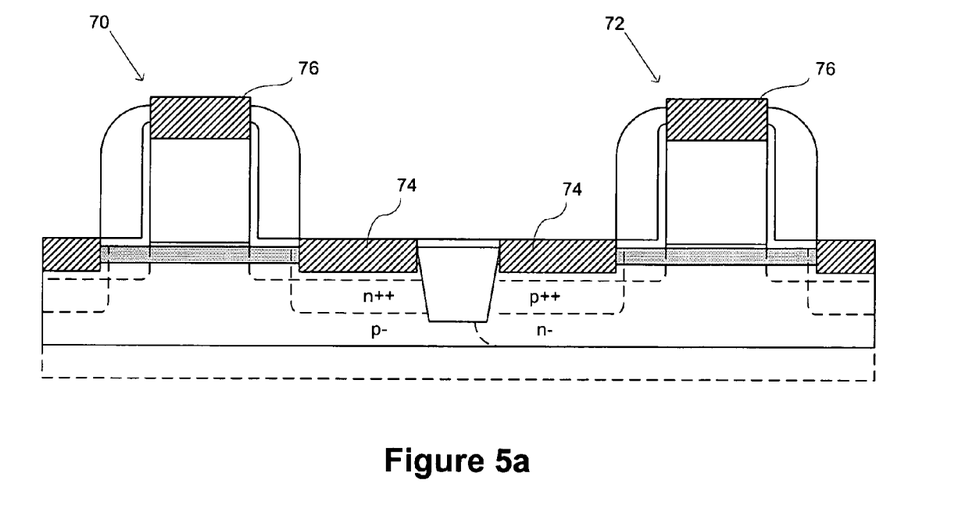
FIGS. 5a, 5b, 5c, 5d, 5e and 5f show NMOS and PMOS structures formed in accordance with a first preferred embodiment of the invention.

FIG. 5a shows a structure comprising an NMOS device 70 and a PMOS device 72. Each of the devices 70, 72 is comprised of elements as illustrated in FIG. 4i, and each further includes respective source and drain silicides 74 and gate silicides 76. The source and drain silicides 74 and gate silicides 76 may be formed from the structure of FIG. 4i by removing the protective cap from the tops of the gates and exposing the source and drain regions, depositing a thin conformal layer of a metal over the substrate, and then annealing to promote silicide formation at the points of contact between the metal and underlying semiconductor materials, followed by stripping of residual metal. Nickel (Ni) is a preferred metal for the silicides, but other metals such as cobalt (Co) may be used.

Figure 5B:
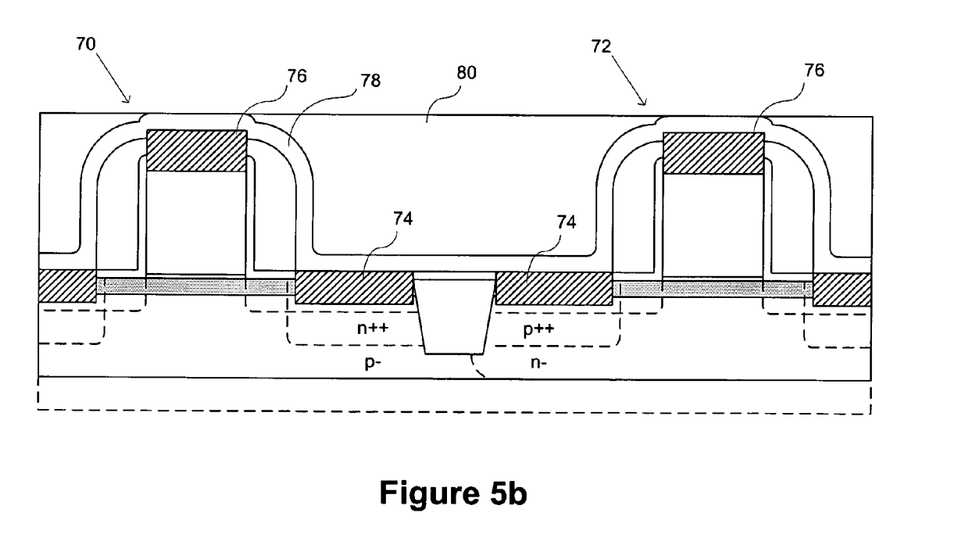

FIG. 5b shows the structure of FIG. 5a after formation of a conformal silicon nitride protective layer 78 over the devices 70, 72, followed by deposition and planarization of a silicon oxide layer 80. The silicon oxide layer 80 is planarized to expose the silicon nitride layer 78 at the tops of the gates.

Figure 5C:
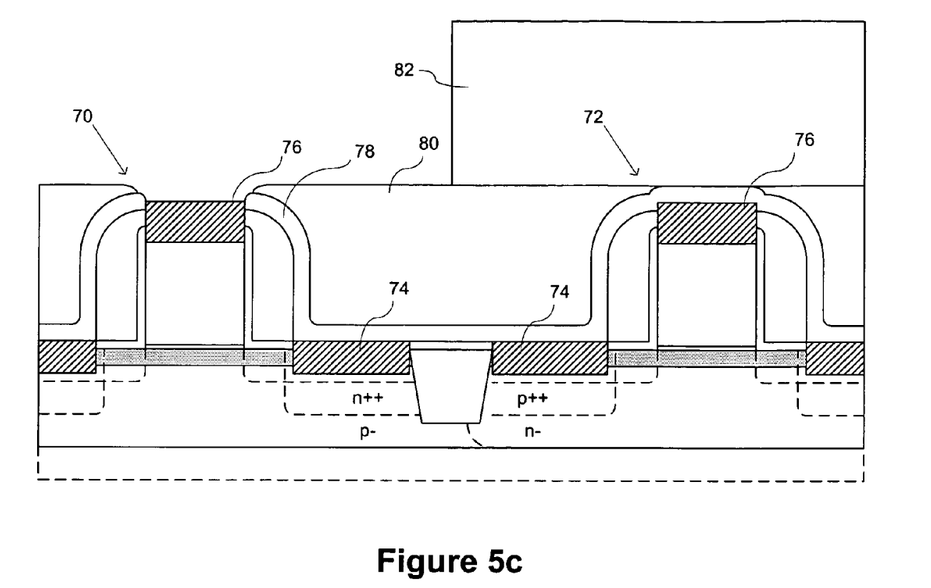

FIG. 5c shows the structure of FIG. 5b after selective masking of the PMOS device 72 using a photoresist mask 82, followed by etching of the silicon nitride protective layer 78 to expose the silicide portion 76 of the NMOS gate.

Figure 5D:
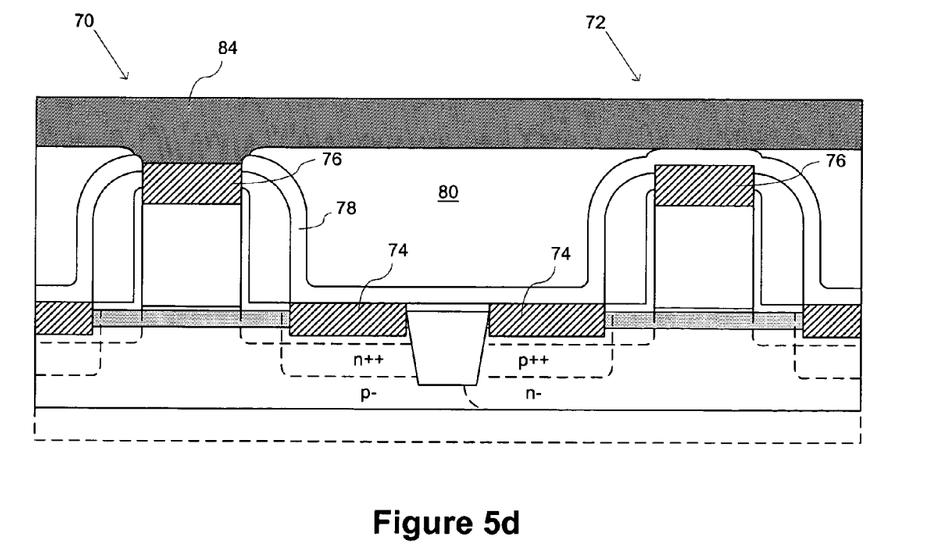

FIG. 5d shows the structure of FIG. 5c after removal of the photoresist mask, followed by formation of a conformal layer of metal 84 over the silicon oxide layer 80 and in contact with the NMOS gate silicide 76. The metal is preferably the same metal used to form the initial PMOS and NMOS gate, source and drain silicides. The thickness of the metal layer 84 is chosen to provide sufficient material to fully silicide the NMOS gate.

Figure 5E:
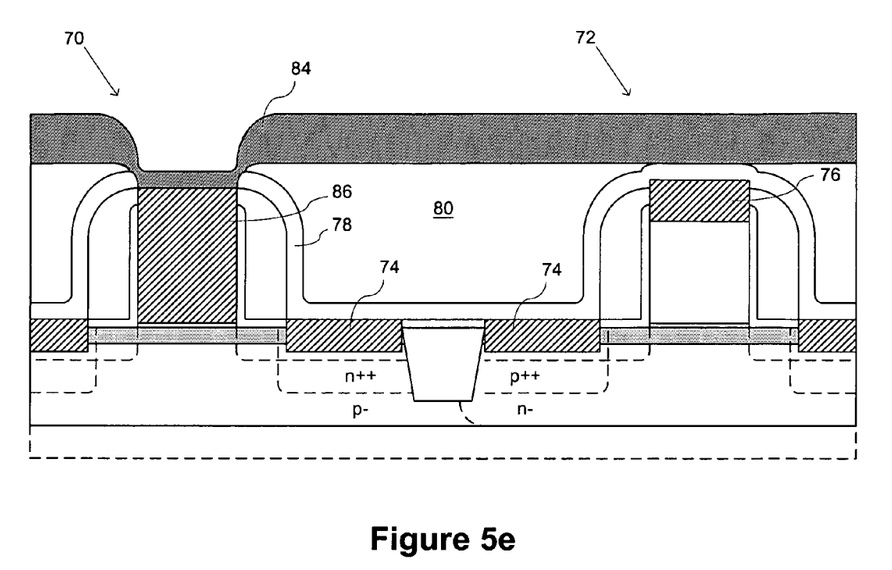
Figure 5F:
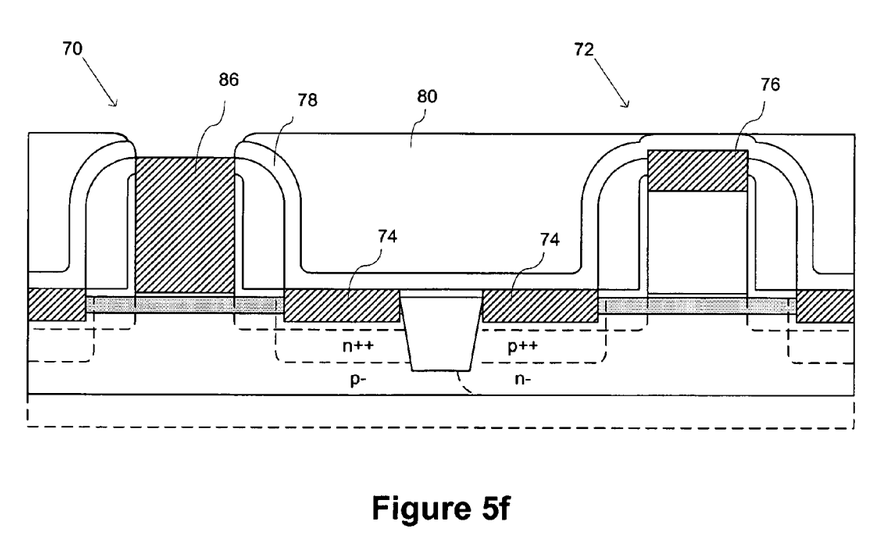

FIG. 5e shows the structure of FIG. 5d after annealing to promote silicidation of the NMOS gate to form a fully silicided NMOS gate 86. FIG. 5f shows the structure of FIG. 5e after removal of residual metal. The resulting NMOS gate has a higher work function than the PMOS gate, which effectively raises the threshold voltage of the NMOS device and thus makes the effective NMOS threshold voltage closer to the PMOS threshold voltage.

Figure 6:
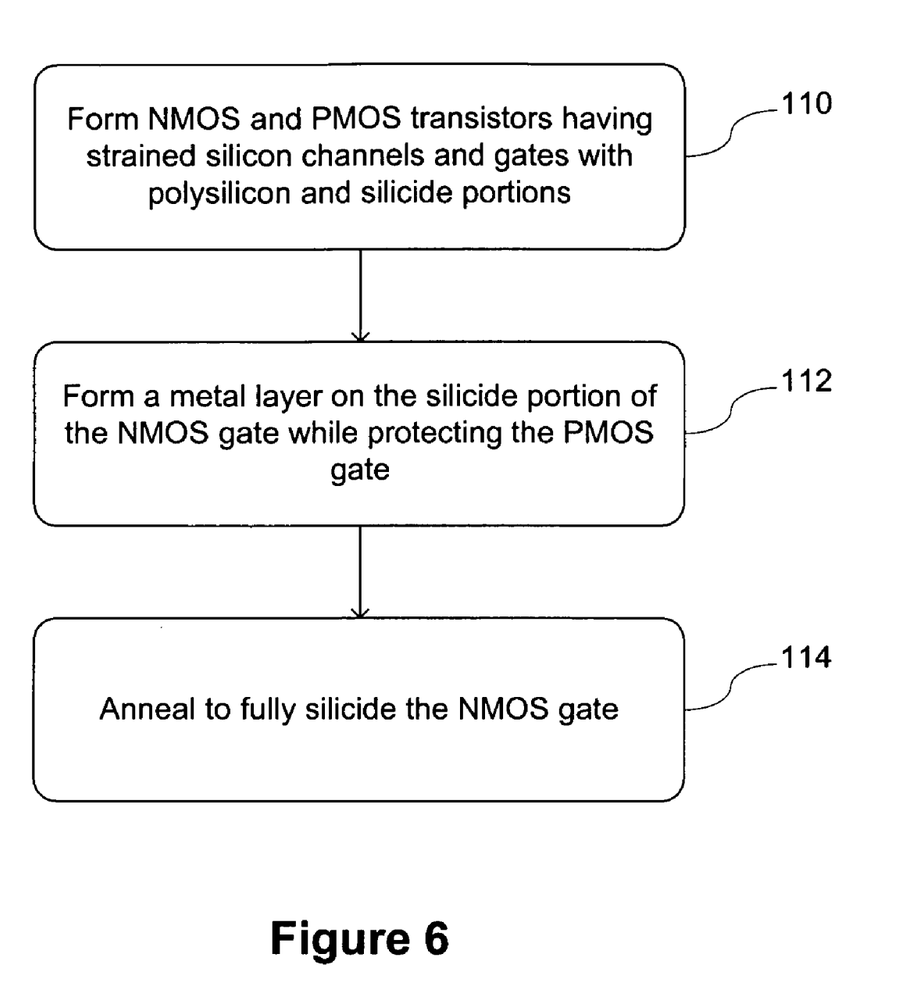
FIG. 6 shows a process flow encompassing the first preferred embodiment and alternative embodiments.

FIG. 6 shows a process flow encompassing the first preferred embodiment and other alternative embodiments. Initially an NMOS transistor and a PMOS transistor having strained silicon channel regions and gates comprising polysilicon portions and silicide portions are formed (110). A metal layer is then formed in contact with the silicide portion of the NMOS gate while the PMOS gate is protected (112), and annealing is performed to fully silicide the NMOS gate (114). After annealing, the gate of the NMOS transistor has a work function that exceeds a work function of the gate of the PMOS transistor so as to compensate for the difference in the respective threshold voltages of the NMOS transistor and the PMOS transistor caused by the layer of strained silicon in the NMOS channel. The difference of the work functions of the NMOS and PMOS gates is preferably approximately the same as the difference of the threshold voltages of the NMOS and PMOS transistors.

FIGS. 7a–7g show structures formed during processing in accordance with a second preferred embodiment of the invention. In this embodiment, a fully silicided NMOS gate and a partially silicided PMOS gate are formed simultaneously in a single silicidation process.

Figure 7A:
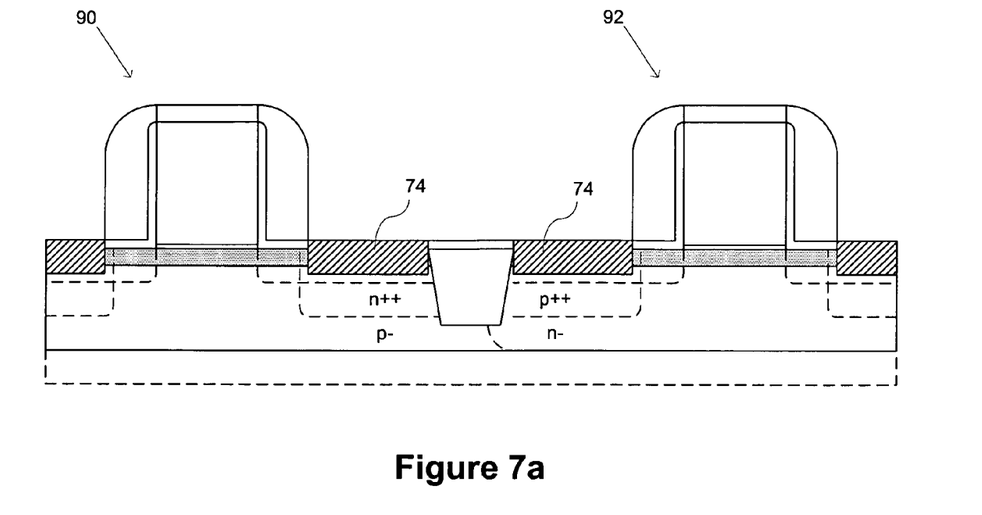
FIGS. 7a, 7b, 7c, 7d, 7e, 7f and 7g show NMOS and PMOS structures formed in accordance with a second preferred embodiment of the invention.

FIG. 7a shows a structure comprising an NMOS device 90 and a PMOS device 92. Each of the devices 90, 92 is comprised of elements as illustrated in FIG. 4i, and further includes respective source and drain silicides 74. The source and drain silicides 74 may be formed from the structure of FIG. 4i by exposing the source and drain regions, depositing a thin conformal layer of the metal over the substrate, and then annealing to promote silicide formation at the points of contact between the metal and underlying semiconductor materials, followed by stripping of residual metal. Nickel (Ni) is a preferred metal for the silicides, but other metals such as cobalt (Co) may be used.

Figure 7B:
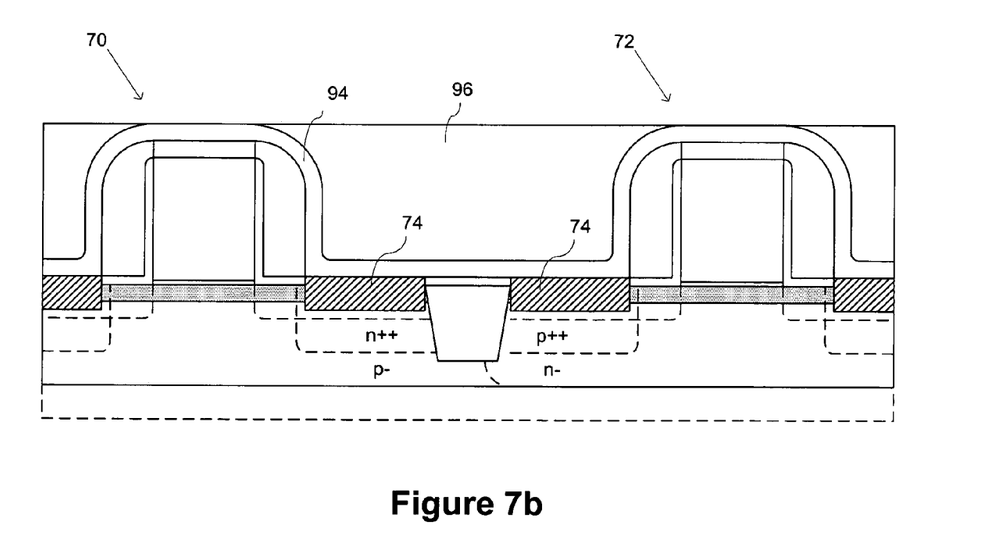

FIG. 7b shows the structure of FIG. 7a after formation of a conformal silicon nitride protective layer 94 over the devices 90, 92, followed by deposition and planarization of a silicon oxide layer 96. The silicon oxide layer 96 is planarized to expose the silicon nitride layer 94 at the tops of the gates.

Figure 7C:
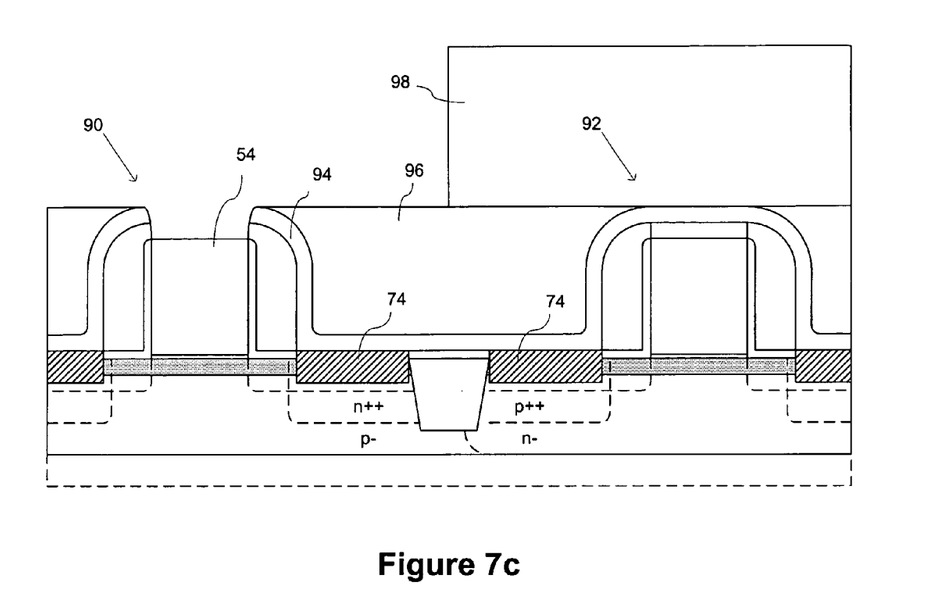

FIG. 7c shows the structure of FIG. 7b after selective masking of the PMOS device 92 using a photoresist mask 98, followed by etching of the silicon nitride protective layer 94 and silicon oxynitride protective cap to expose the gate 54 of the NMOS device.

Figure 7D:
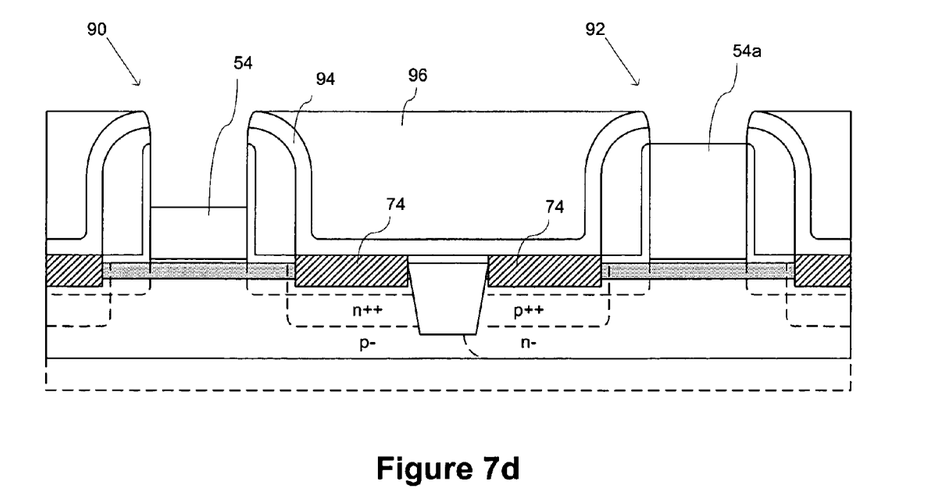

FIG. 7d shows the structure of FIG. 7c after removal of the photoresist mask, followed by etching to remove a portion of the NMOS gate 54, and further etching to remove the silicon nitride protective layer 94 and the silicon oxynitride protective cap from above the PMOS gate 54a.

Figure 7E:
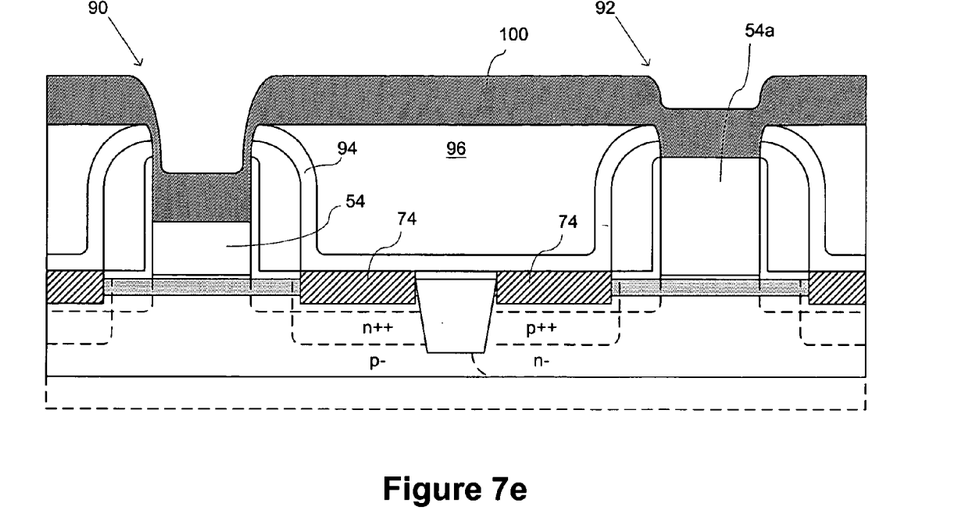

FIG. 7e shows the structure of FIG. 7d after formation of a conformal layer of metal 100 over the silicon oxide layer 96 and in contact with the NMOS gate 54 and the PMOS gate 54a. The metal is preferably nickel (Ni) but may be another metal such as cobalt (Co). The thickness of the metal layer 84 is chosen to provide sufficient material to fully silicide the remaining amount of NMOS gate polysilicon material.

Figure 7F:
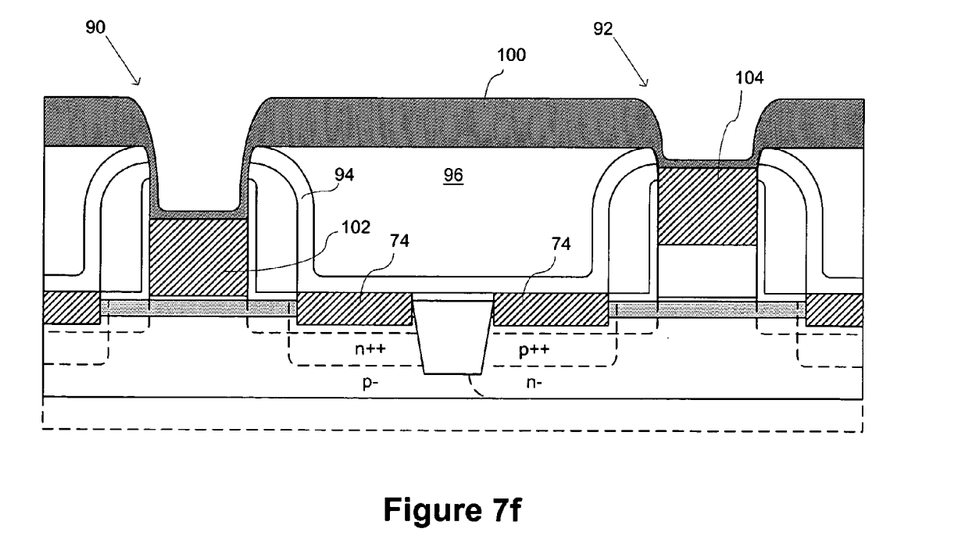
Figure 7G:
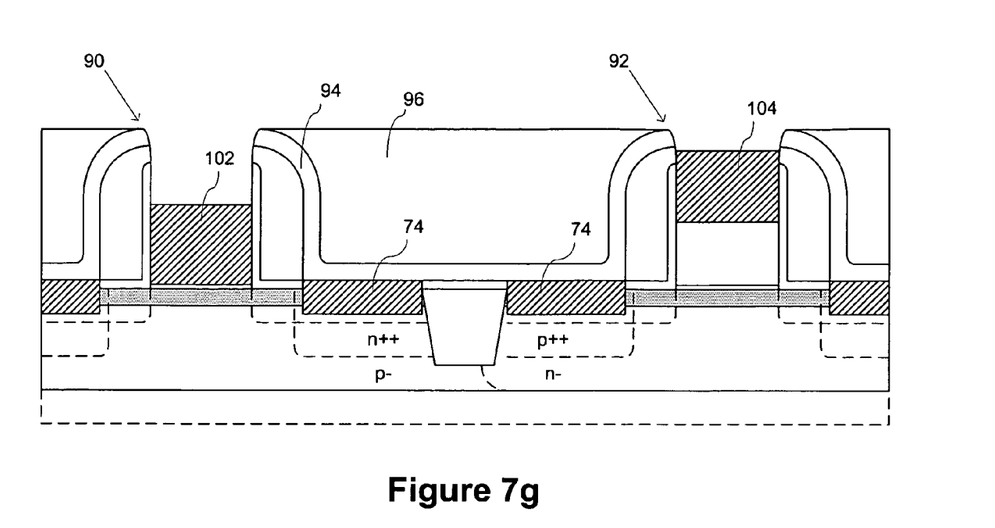

FIG. 7f shows the structure of FIG. 7e after annealing to promote silicidation at the NMOS gate to form a fully silicided NMOS gate 102 and a silicided portion 104 of the PMOS gate. The amount of silicide formed at each gate is approximately the same, however at the NMOS gate the entire thickness of polysilicon extending to the gate insulator is fully silicided, whereas an unsilicided portion of polysilicon remains in contact with the gate insulator at the PMOS gate. Thus the NMOS gate is fully silicided while the PMOS gate is partially silicided. FIG. 7g shows the structure of FIG. 7f after removal of residual metal.

Figure 8:
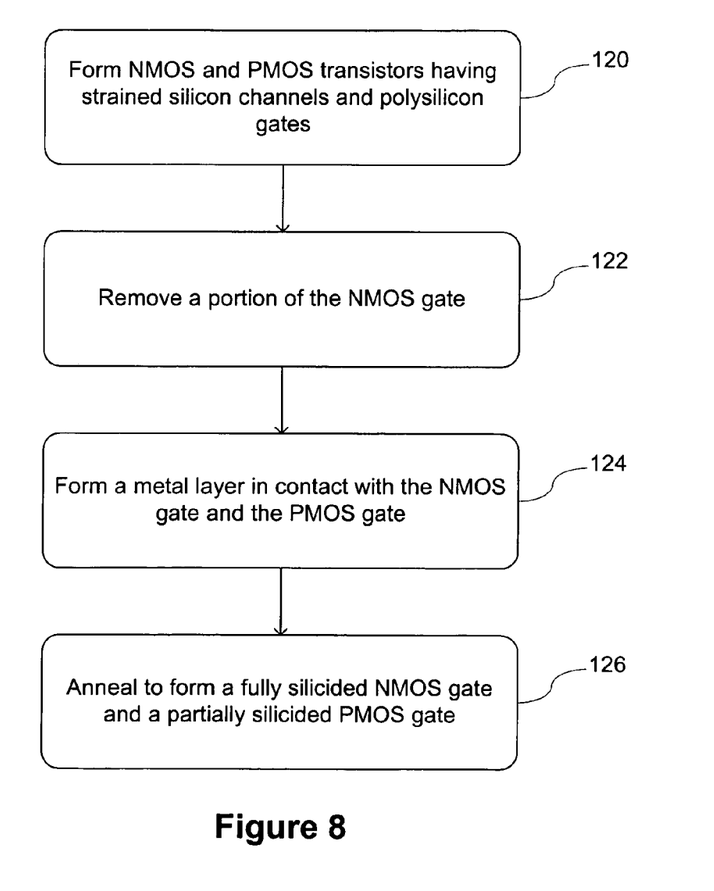
FIG. 8 shows a process flow encompassing the second preferred embodiment and alternative embodiments.

FIG. 8 shows a process flow encompassing the second preferred embodiment and alternative embodiments. Initially an NMOS transistor and a PMOS transistor having strained silicon channels and polysilicon gates are formed (120). A portion of the NMOS polysilicon gate is removed (122). A metal layer is formed in contact with the NMOS gate and the PMOS gate (124), and annealing is then performed to form a fully silicided NMOS gate and a partially silicided PMOS gate (126). The gate of the NMOS transistor has a work function that exceeds a work function of the gate of the PMOS transistor so as to compensate for a difference in respective threshold voltages of the NMOS transistor and the PMOS transistor caused by the strained silicon of the NMOS channel region. The difference of the work functions of the NMOS and PMOS gates is preferably approximately the same as the difference of the threshold voltages of the NMOS and PMOS transistors.

Figure 9:
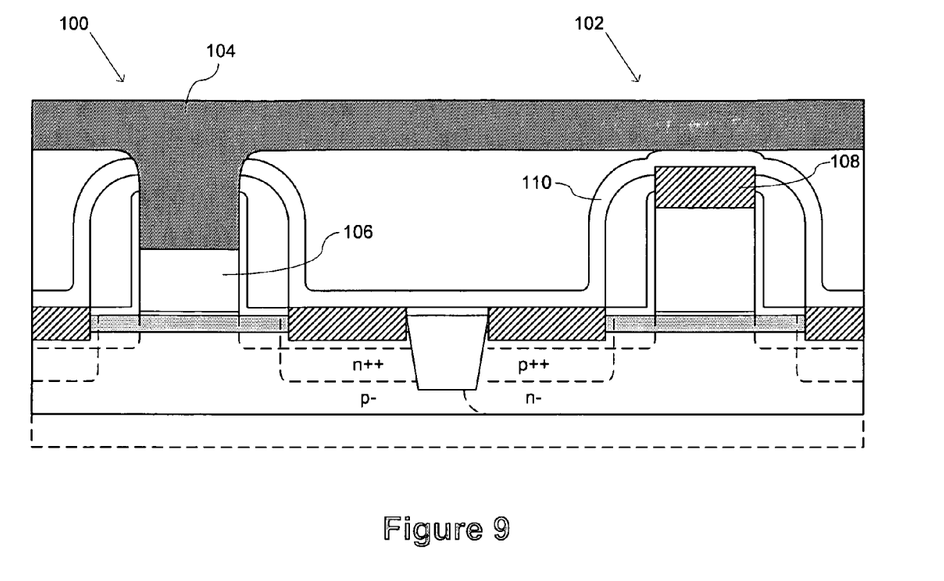
FIG. 9 shows a structure formed during processing in accordance with a third preferred embodiment.

FIG. 9 shows a structure formed during processing in accordance with a third preferred embodiment. In the third preferred embodiment, silicidation of the NMOS gate is performed independently of silicidation of the PMOS gate. As shown in FIG. 9, silicidation of the NMOS gate is performed by forming a metal layer 114 in contact with the exposed surface of the polysilicon gate 112 of an NMOS transistor 106, while a previously silicided portion 114 of the gate of the PMOS transistor 108 remains protected by a silicon nitride protective layer 116. The PMOS gate silicides may be formed concurrently with the formation of source and drain silicides while retaining a protective cap over the NMOS gates, or may be formed independently of the formation of other silicides. Annealing is then performed to fully silicide the NMOS gate. Portions of the NMOS gates may be removed by etching prior to silicidation, and the metal used to silicide the NMOS gates may be different than the metal used to form the silicided portion of the PMOS gate. The third preferred embodiment provides completely independent silicidation of the NMOS gate and the PMOS gate, thus enabling greater control over the properties of each gate silicide.

Figure 10:
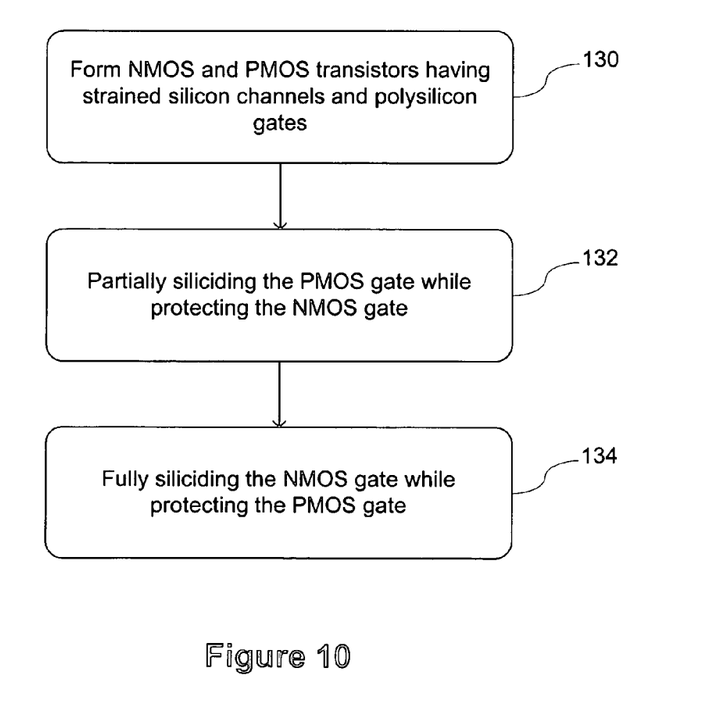
FIG. 10 shows a process flow encompassing the third preferred embodiment and alternative embodiments.

FIG. 10 shows a process flow encompassing the third preferred embodiment and alternative embodiments. Initially NMOS and PMOS transistors having strained silicon channels and polysilicon gates are formed (130). The PMOS gate is then partially silicided while protecting the NMOS gate (132). The NMOS gate is then fully silicided while protecting the PMOS gate (134). After silicidation, the NMOS gate has a work function that exceeds the work function of the PMOS gate so as to compensate for a difference in respective threshold voltages of the NMOS transistor and the PMOS transistor caused by the strained silicon of the NMOS channel region. The difference of the work functions of the NMOS and PMOS gates is preferably approximately the same as the difference of the threshold voltages of the NMOS and PMOS transistors. For purposes of this embodiment, silicidation of the PMOS and NMOS gates may be done in any order.

While the processing discussed in relation to FIGS. 5a–5f, 7a–7g and 9 represents three presently preferred embodiments, a variety of further alternatives may also be implemented. For example, while the preferred embodiments provide different NMOS and PMOS silicidation in the context of strained silicon devices fabricated on a semiconductor substrate, analogous processing is equally applicable to strained silicon devices formed on SOI substrates, including FinFETs.

Accordingly, a variety of NMOS and PMOS gate structures may be implemented in accordance with the invention. In general terms, such structures are characterized by an NMOS transistor and a PMOS transistor that are each formed on a substrate and that have strained silicon channel regions. The gate of the NMOS transistor has work function that exceeds the work function of the gate of the PMOS transistor so as to compensate for a difference in respective threshold voltages of the NMOS transistor and the PMOS transistor that is caused by the strained silicon in the channel regions. The difference in the work functions of the NMOS and PMOS gates is preferably approximately the same as the difference in the threshold voltages of the NMOS and PMOS transistors. The NMOS gate is preferably fully silicided while the PMOS gate is partially silicided. The NMOS and PMOS devices may be formed on a semiconductor substrate or on an SOI substrate, and may be FinFETs. The NMOS and PMOS devices may be part of a single CMOS device or may be independent devices formed on the same substrate. While the examples provided herein focus on the gates of a single NMOS device and a single PMOS device, it will be appreciated that the gates of multiple NMOS devices and PMOS devices may be formed simultaneously.

The tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Also, while tasks performed during the fabrication of structure described herein are shown as occurring in a particular order for purposes of example, in some instances the tasks may be performed in different orders. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method of forming a semiconductor device, comprising:

forming an NMOS transistor and a PMOS transistor having respective gates each comprising a polysilicon portion and a silicide portion, wherein channel regions of the NMOS transistor and the PMOS transistor comprise strained silicon;

forming a metal layer in contact with the silicide portion of the NMOS gate while protecting the PMOS gate; and annealing to fully silicide the NMOS gate.

2. The method claimed in claim 1, wherein, after annealing, the gate of the NMOS transistor has a work function that exceeds a work function of the gate of the PMOS transistor so as to compensate for a difference in respective threshold voltages of the NMOS transistor and the PMOS transistor caused by the strained silicon of the channel regions.

3. The method claimed in claim 2, wherein the difference of the work functions of the NMOS and PMOS gates is approximately the same as the difference of the threshold voltages of the NMOS and PMOS transistors.

4. The method claimed in claim 1, wherein forming the metal layer in contact with the silicide portion of the NMOS gate while protecting the PMOS gate comprises:

forming a conformal protective layer over the NMOS transistor and the PMOS transistor;

forming a silicon oxide layer over the protective layer;

planarizing the silicon oxide layer to exposed portions of the protective layer above the respective gates;

masking the PMOS transistor;

etching the protective layer to expose the silicide portion of the NMOS gate; and forming the metal layer in contact with the exposed silicide portion of the NMOS gate.

* * * * *